(12) United States Patent
Casey et al.

(10) Patent No.: US 7,199,450 B2
(45) Date of Patent: Apr. 3, 2007

(54) MATERIALS AND METHOD TO SEAL VIAS IN SILICON SUBSTRATES

(75) Inventors: Jon A. Casey, Poughkeepsie, NY (US); Michael Berger, New Paltz, NY (US); Leena P. Buchwalter, Hopewell Junction, NY (US); Donald F. Canaperi, Bridgewater, CT (US); Raymond R. Horton, Dover Plains, NY (US); Anurag Jain, Poughkeepsie, NY (US); Eric D. Perfecto, Poughkeepsie, NY (US); James A. Tornello, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,480

(22) Filed: May 13, 2005

(65) Prior Publication Data
US 2006/0255480 A1    Nov. 16, 2006

(51) Int. Cl.
*H01L 29/06* (2006.01)
*H01L 23/58* (2006.01)

(52) U.S. Cl. .................. 257/622; 257/643; 257/647; 257/E21.546; 257/E21.553; 257/E21.585

(58) Field of Classification Search ................ 257/622, 257/643, 647, E21.546, E21.553, E21.585
See application file for complete search history.

(56) References Cited

U.S. PATENT DOCUMENTS

| | | | |
|---|---|---|---|
| 5,904,502 A * | 5/1999 | Ference | ............ 438/118 |
| 5,998,292 A | 12/1999 | Black et al. | |
| 6,593,644 B2 | 7/2003 | Chiu et al. | |
| 6,740,931 B2 * | 5/2004 | Kouzuki et al. | ............ 257/341 |

* cited by examiner

*Primary Examiner*—Ngâen V. Ngô
(74) *Attorney, Agent, or Firm*—DeLio & Peterson, LLC; Robert Curcio; Ira D. Blecker

(57) ABSTRACT

Sealing a via using a soventless, low viscosity, high temperature stable polymer or a high solids content polymer solution of low viscosity, where the polymeric material is impregnated within the via at an elevated temperature. A supply chamber is introduced to administer the polymeric material at an elevated temperature, typically at a temperature high enough to liquefy the polymeric material. The polymeric material is introduced through heated supply lines under force from a pump, piston, or a vacuum held within said supply chamber.

7 Claims, 8 Drawing Sheets

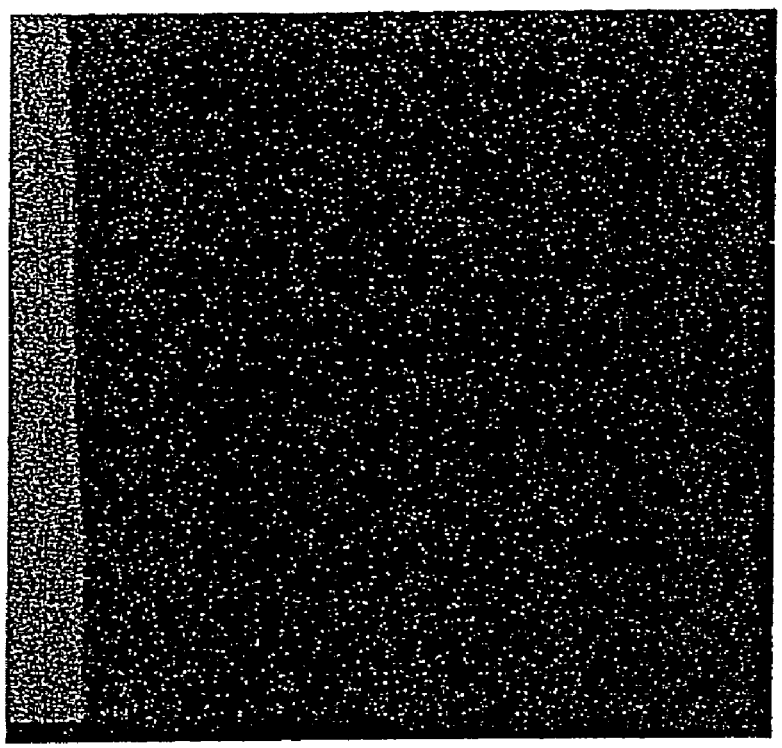
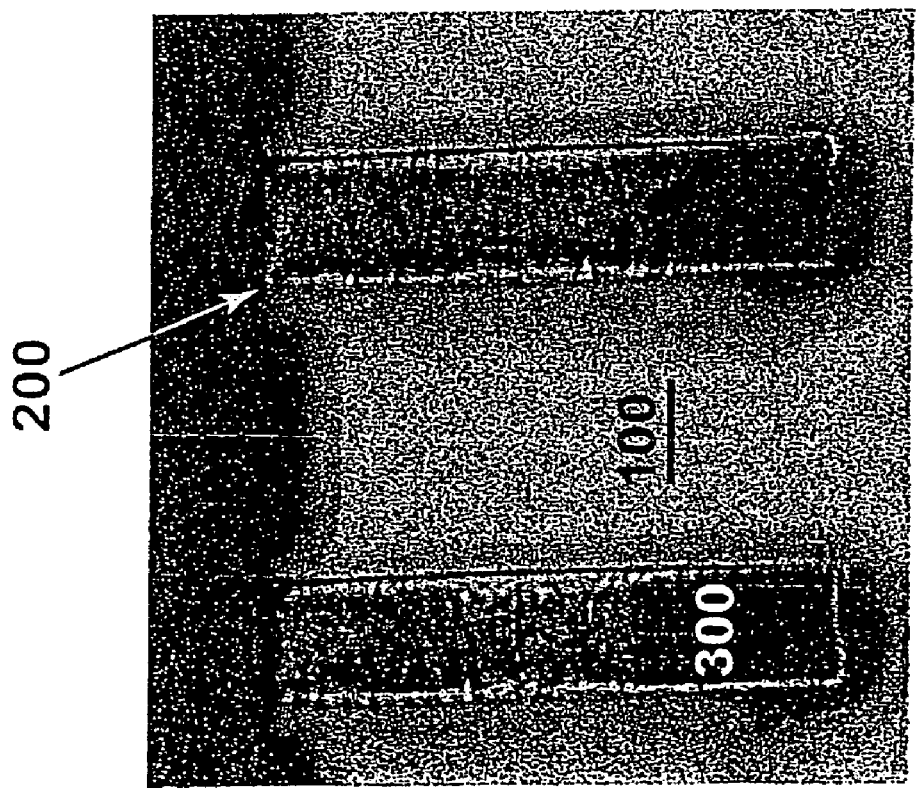
FIG.7 B
FIG.7 A

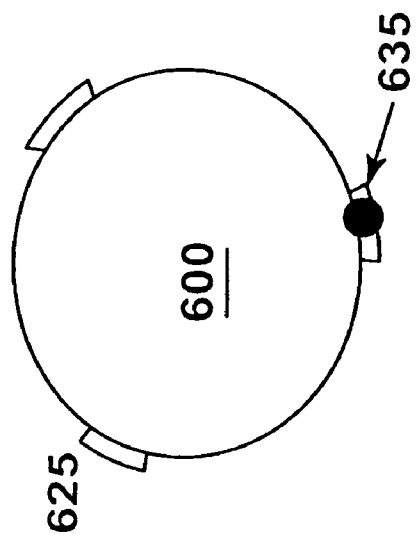
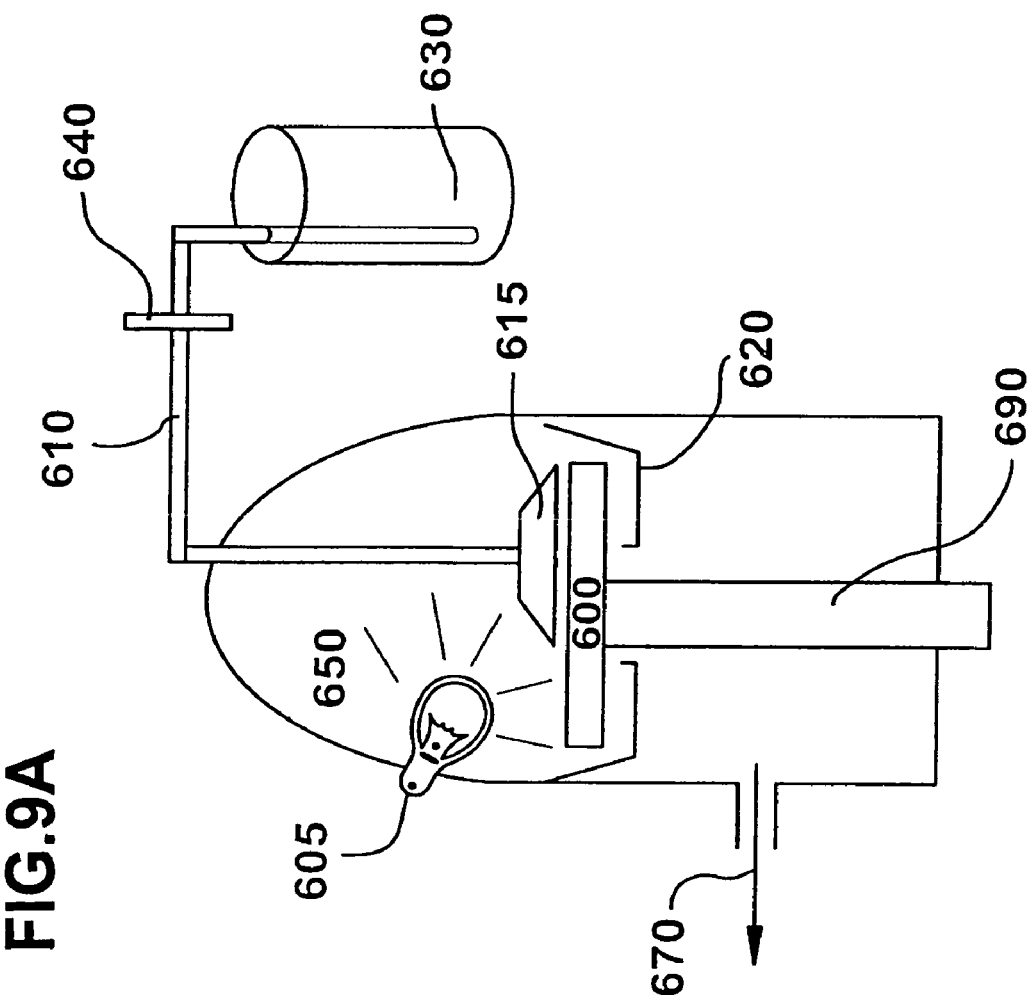
FIG.9B
FIG.9A

Jet Copper cap

MATERIALS AND METHOD TO SEAL VIAS IN SILICON SUBSTRATES

BACKGROUND OF THE INVENTION

1. Field of the Invention

The present invention relates generally to integrated circuits, particularly to a semiconductor or glass substrate-based carrier for mounting and packaging multiple integrated circuit chips and/or other devices.

2. Description of Related Art

Formation and metallization of deep vias in silicon (Si) substrates used for packaging applications is difficult to achieve with the current state-of-the-art processes. One obstacle has been the via size requirement for packaging applications, which is typically much larger than a via used in VLSI device applications. After a via has been metallized, the larger sized via can cause high thermal-mechanical stresses within the surrounding structure. Metallization of vias in silicon is typically achieved using either metal deposition, such as plasma vapor deposition (PVD), plasma-enhanced chemical vapor deposition (PECVD), chemical plating, or a combination of these techniques. The resultant via is metallized with essentially pure metals or metal alloys. The high coefficient of thermal expansion (CTE) of metal, along with a relatively high elastic modulus, results in high thermal-mechanical stress within the via and within the surrounding silicon. The high stress levels can form cracks within the surrounding silicon and/or cause interfacial failure at the via metal/silicon interface.

One solution to this problem has been to utilize lower CTE composite material(s) to fill the via. Filling via holes in silicon with a composite material involves making a composite paste or suspension and then filling the via hole with the paste/suspension. A sintering step is required to "densify" the conductive component of the composite via. Since the composite paste or suspension is comprised of particles, complete, solid filling of the via holes is not possible. Typically, the porosity of the composite paste-filled via is about forty to fifty percent. This means the via can trap liquids and contaminants in its pore-network. The trapped materials will ultimately outgas and volatilize in subsequent processing steps and create severe problems. Thus, a method to seal the via porosity is necessary to prevent the ingress of liquids and contaminants. Additionally, the sealed via must be able to withstand all downstream processes required for fabrication of the silicon carrier as well as chip attachment. FIG. 1 depicts a exploded portion of a paste-filled via 300 after blanket metallization without a via seal. Structures 310 develop during post metallization high temperature excursion where liquid penetrant is volatilized, bringing with it components of the paste, which then solidify on the surface during the high temperature excursion.

SUMMARY OF THE INVENTION

Bearing in mind the problems and deficiencies of the prior art, it is therefore an object of the present invention to provide a method of sealing a via using a solventless low viscosity high temperature stable polymer.

It is an object of the present invention to seal porous vias in silicon structures.

It is another object of the present invention to provide a method for impregnating a paste-filled deep via in a silicon substrate using a high solid content polymer solution of low viscosity.

A further object of the present invention is provide a sealing solution to porous vias that can infiltrate into the small pores of the via structure.

Another object of the present invention is to provide a sealing solution to porous vias that is capable of surviving processing temperatures greater than 360° C.

Yet another object of the present invention is to provide a sealing solution to porous vias that has good adhesion characteristics with low CTE via materials, silicon, and via liner materials.

Still other objects and advantages of the invention will in part be obvious and will in part be apparent from the specification.

The above and other objects, which will be apparent to those skilled in art, are achieved in the present invention, which is directed to a semiconductor chip package assembly comprising: a silicon substrate; at least one semiconductor chip; at least one electrically conductive via in the silicon substrate having at least one exposed end and porous material filled therein; and a sealant sealing the porous material of the at least one electrically conductive via. The sealant comprises a polymeric material. The polymeric material includes a polyimide material or a high thermally stable, thermally curable material. The polymeric material may also include a polyimide precursor solution. The polyimide precursor solution may include a high percentage concentration of solids having viscosity approximately 1 cP to approximately 150 cP. The polyimide material is neat thermally curable material with low viscosity and low melting point in its precursor state. The thermally stable, thermally curable material includes a polyamidoamine material such as Matrimid®, or PMDA-ODA, BPDA-PDA, or PI2562. The sealant may also include a deposited copper coating.

In a second aspect, the present invention is directed to a method of sealing a via having a top end and a bottom end, within a semiconductor silicon substrate in a semiconductor chip package assembly comprising sealing the top end of the via with a polymeric material, such that impregnation of the polymeric material is performed at an elevated temperature. The method further comprises thinning the silicon substrate to expose the bottom end of the via and sealing the bottom end of the via using the polymeric material. The method may include sealing the top end of the via with the polymeric material comprising a solventless, low viscosity, high temperature stable polymer. The method may also include filling the via with a porous, composite paste material having a conductive component and sintering the via to densify the conductive component of the paste material. The method further includes sealing the top end of the via with a high solids content polymer solution having low viscosity for impregnating the via.

In a third aspect, the present invention is directed to an apparatus for controlling ambient conditions when applying sealant material to paste-filled vias in a semiconductor silicon substrate, the apparatus comprising: a supply chamber thermally encapsulated for heating to a temperature capable of liquefying polymeric material; thermally isolated supply tubing for delivering the polymeric material at approximately the supply chamber temperature; a valve in the supply tubing for allowing polymeric material flow; a supply nozzle controlling flow of the polymeric material into the supply chamber; and a mechanical chuck adapted for mounting and holding the silicon substrate, the chuck resistively or radiantly heated. The apparatus includes a vacuum pump in fluid communication with the supply chamber, such that when the valve is opened, the polymeric material flows through the supply tubing under vacuum pressure into the supply chamber. A pump or a piston may also be included to promote polymeric material flow through the supply tubing into the supply chamber.

In a fourth aspect, the present invention is directed to a method of sealing a paste-filled via in a silicon substrate, comprising: heating a polymeric material to a liquefying temperature; supplying the heated polymeric material through supply tubes into a supply chamber held at or near the liquefying temperature; applying the polymeric material to a top of the via, thereby impregnating the via with a top sealed surface. The method further includes sealing the via with the polymeric material comprising a solventless, low viscosity, high temperature stable polymer. Additionally, the method may include filling the via prior to applying the polymeric material with a porous, composite paste material having a conductive component, and sintering the via to densify the conductive component of the paste material.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 7 depicts bright field and fluorescence microscope images of the sample of FIG. 6.

FIG. 9 depicts an apparatus for applying the hot, low viscosity material using a heated wafer spinner in an enclosed system, which allows for control of the pressure in the environment.

DESCRIPTION OF THE PREFERRED EMBODIMENT(S)

In describing the preferred embodiment of the present invention, reference will be made herein to FIGS. 1–10 of the drawings in which like numerals refer to like features of the invention. It is to be understood that the invention is not limited to those aspects depicted in the figures.

The present invention is directed to a silicon-carrier with deep-through vias. The silicon-carrier is usually used for bonding a multitude of varied technology chips as if they were one chip. The package is then bonded to a second level package having an electrical connection through the silicon carrier through the deep-through vias.

Selection of sealing material for a paste-filled via is driven by a number of factors: a) its ability to seal the top layer of the via, on the order of tens of micrometers deep; b) good adhesion properties to the paste; c) via sidewall metallization; d) the percentage content of solids; e) mechanical properties; f) good thermal stability; and g) good chemical mechanical polishing characteristics.

In a first embodiment present invention provides a method of sealing a via using a high temperature stable material, such as polyamidoamine material, namely Matrimid® or other like material. This material may be used heated or mixed with n-methyl-2-pyrollidone (NMP) at concentrations on the order of 20% to 50%. When used with NMP, the solution may be vacuum impregnated at room temperature into the porous via structure and the NMP subsequently evaporated. The recommended material is then exposed to its melting point, which in the case of Matrimid® or other like material is on the order of 130° C. to 150° C., allowing it to melt and attain a lower viscosity than water. This will promote reflow of the material and additional infiltration into the pore network. A polyimide precursor may be used to allow for a higher solid content, while still maintaining a relatively low viscosity. One type of polyimide precursor material is PI2562-type material.

The thermo-plastic behavior of the material prior to cure is important to achieving a dense, hermetic sealing of the pore network. Curing of Matrimid® and like materials may be accomplished by holding the material at 130° C. to 150° C. for one hour followed by an additional curing at 330° C.

Table I lists some polyimide material properties that meet these requirements. No limitation is presented to the types of materials that may be used, and those listed in Table I are not inclusive of all types of possible materials used in this manner.

TABLE I

| MATERIAL | % SOLIDS | LOWEST VISCOSITY @ TEMPERATURE | ε % | THERMAL STABILITY |
|---|---|---|---|---|
| Poly,4,4-oxydiphenylene pyronellitimide PMDA-ODA | 16 | 30,332 cSt @ ambient temperature 20–23° C. | 120 | 400° C. |
| Biphenyltetra-carboximide BPDA-PDA | 13.5 | 30,000 cSt @ ambient temperature 20–23° C. | | 400° C. |
| PI12562 | 25 | 150 cP @ room temperature | 11 | 400° C. |
| Matrimid ® | 100 | 1 cP @ 130° C. | | 350° C. |

Figure 1:
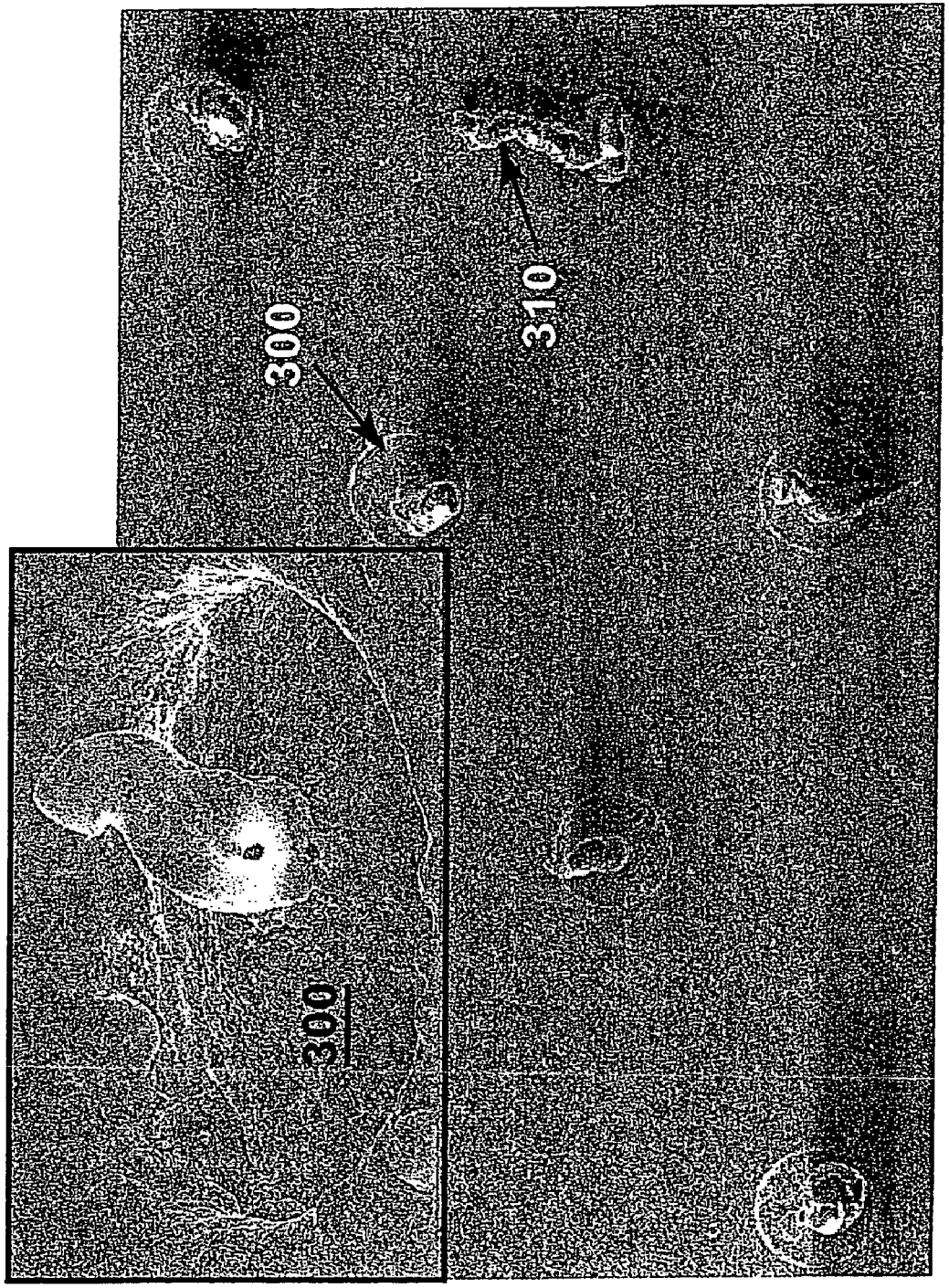
FIG. 1 depicts an exploded portion of a paste-filled via after blanket metallization without a via seal.
Figure 3:
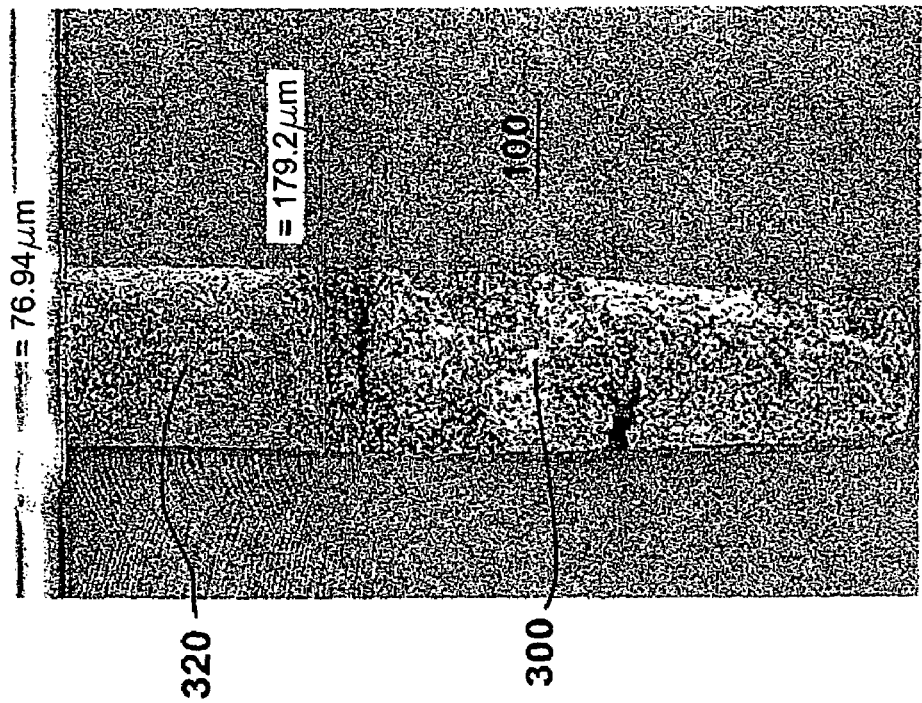
FIG. 3 depicts a paste-filled via, which has been sealed using a solventless, low viscosity polyimide.
Figure 2:
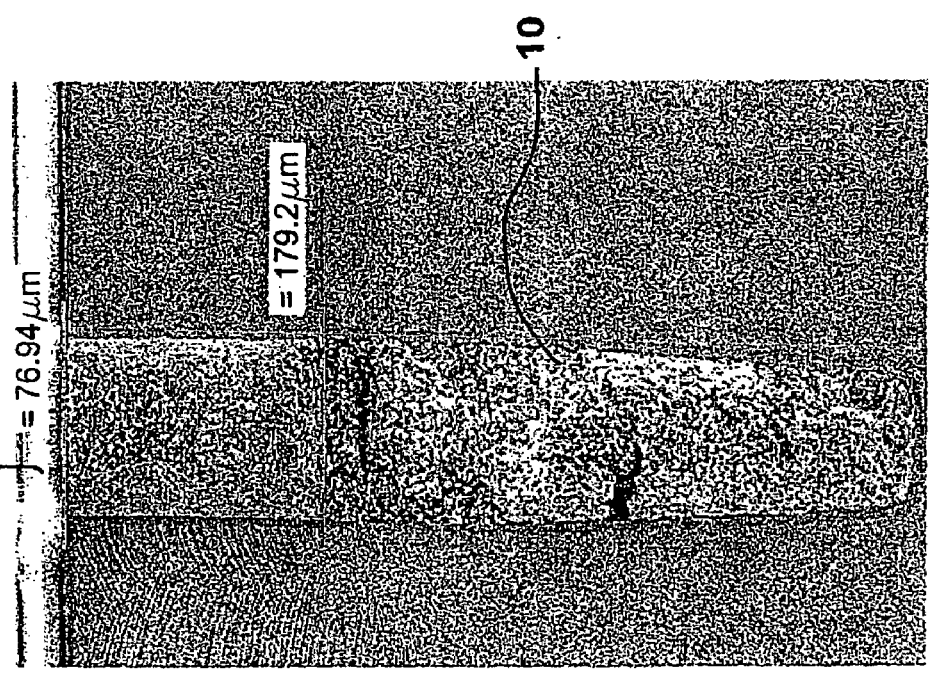
FIG. 2 depicts a Matrimid® sealed porous via.
Figure 4:
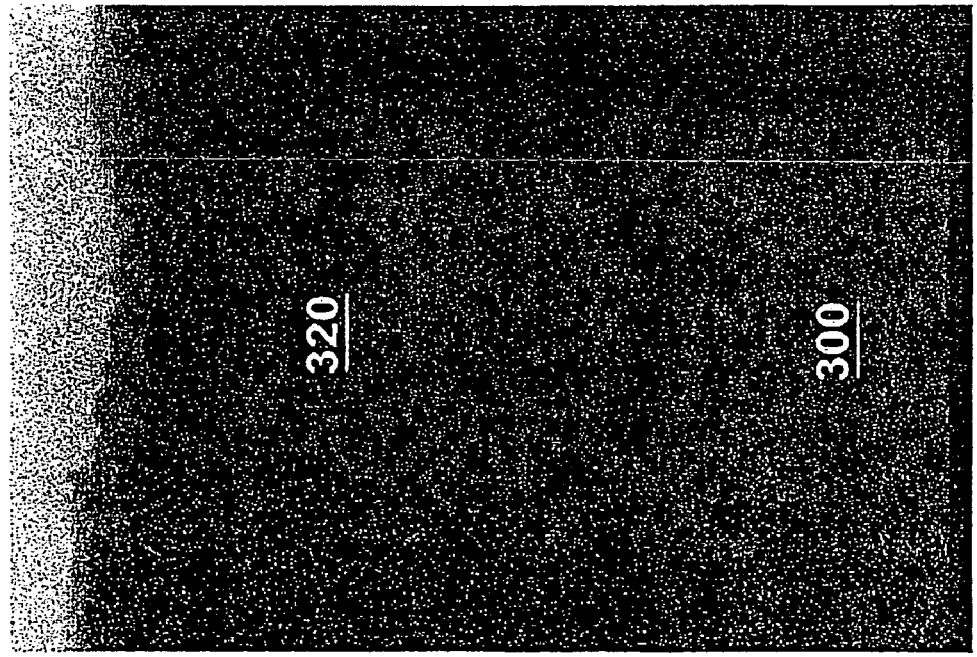
FIG. 4 shows a fluorescence microscopy image of a dye exposed low viscosity polyimide seal in the deep paste-filled via of FIG. 3.

These types of low viscosity material may be applied hot onto the silicon substrate at ambient pressure, thus promoting the sealing of the via. FIG. 2 depicts a Matrimid® sealed porous via 10. The Matrimid® layer 12 penetration depth is controlled to about 70 µm. Preferably, the penetration depth is on the order of tens of micrometers. Once sealed, the via may be exposed to chemical mechanical polishing (CMP) and metal plating processes without the ingress of processing solvents into the originally porous via. FIG. 3 shows an example of a paste-filled via 100, which has been sealed using a solventless, low viscosity polyimide. The polyimide is applied so that it penetrates approximately the top 70 µm, and forms a composite 320 of approximately 100 µm depth between the paste 300 and the polyimide. FIG. 4 shows a fluorescence microscopy image of a dye exposed low viscosity polyimide seal 320 in a deep paste-filled via 300 of FIG. 3.

Figure 5:
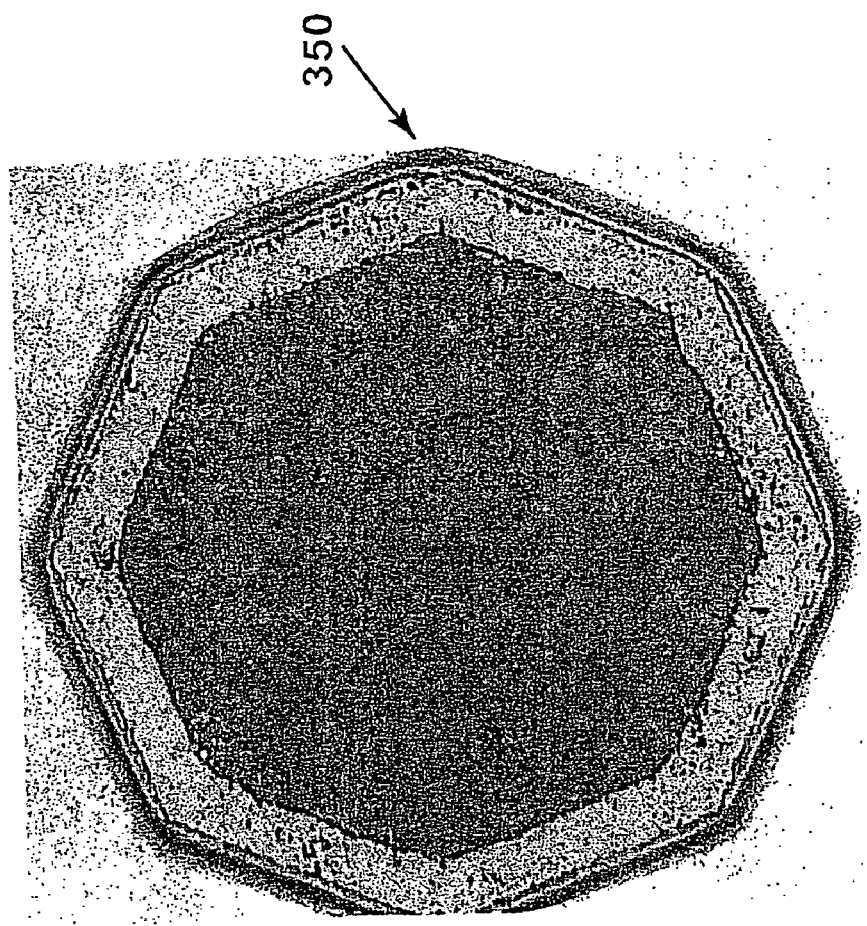
FIG. 5 depicts a top-down image of a polyimide solution sealed via after curing and chemical mechanical processing.
Figure 6:
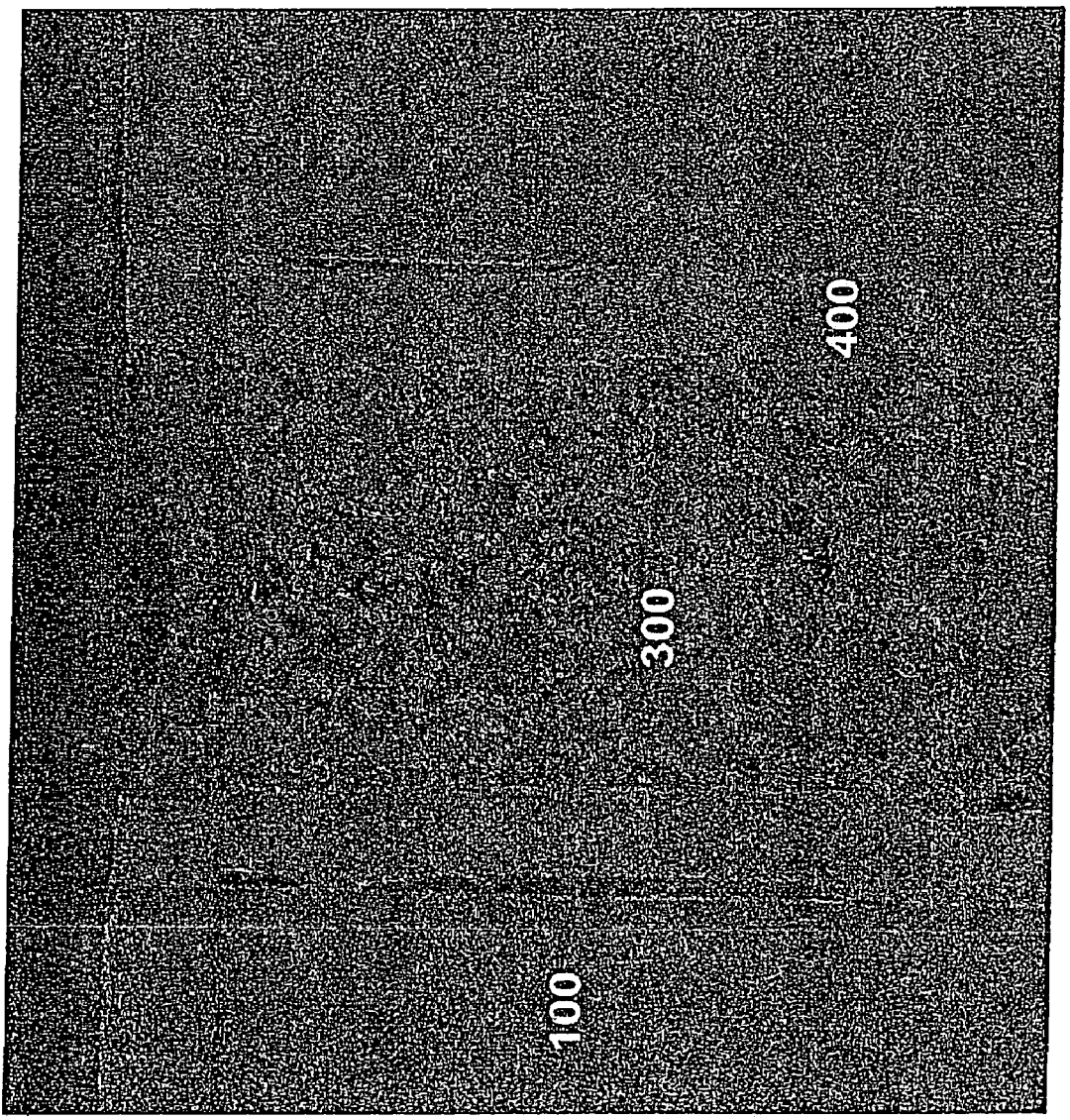
FIG. 6 shows a paste-filled via sealed in a manner of the present invention, lined with solid metal and sealed with the polyimide solution.

FIG. 5 depicts a top-down image of a polyimide solution sealed via 350 after curing and chemical mechanical processing. FIG. 6 shows a paste-filled via 300 sealed in a manner of the present invention, lined with solid metal 400 and sealed with the polyimide solution 200. The via is then cured and exposed to chemical mechanical processing, resulting in the polyimide layer being coplanar with the major surface of the silicon wafer 100.

Bright field and fluorescence microscope images of the sample of FIG. 6 are depicted in FIG. 7. The polymer seal cap 200 is visible in FIG. 7A, showing a lighter color. FIG. 7B verifies that no dye penetrated into the polyimide sealed via after chemical mechanical processing.

Figure 8B:
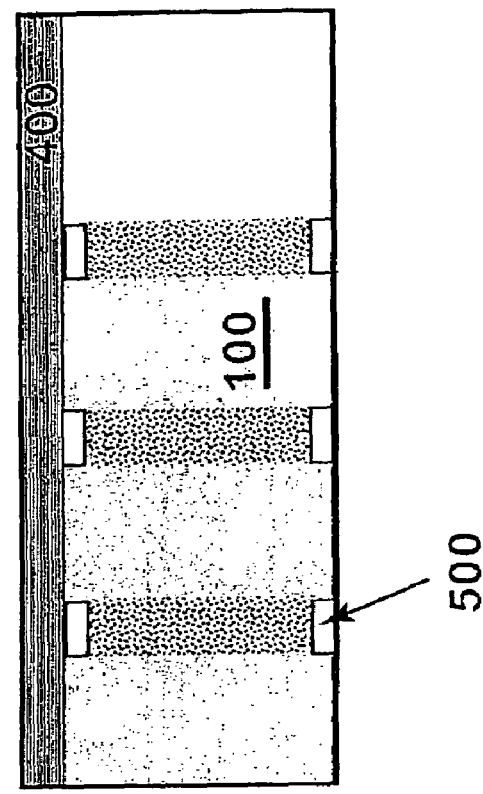
FIG. 8 diagrams a silicon wafer that is ground at the bottom of the paste-filled via and sealed at the top and bottom.
Figure 8A:
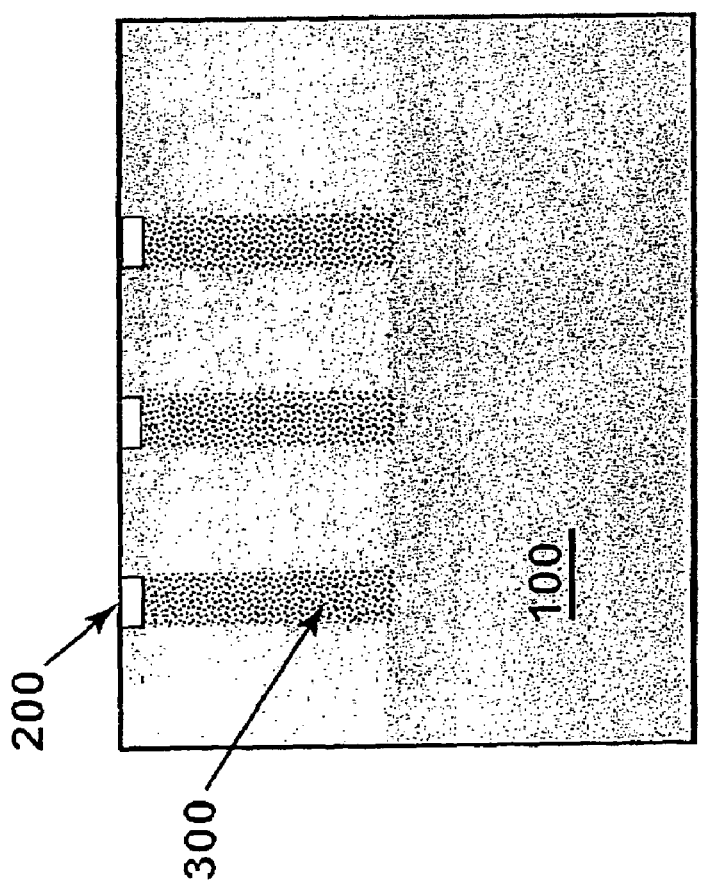

In yet another embodiment, FIG. 8 diagrams a silicon wafer 100 that is ground at the bottom of the paste-filled via 300. The paste-filled via 300 is top sealed with a polyimide solution 200. After bottom grinding, the porous paste in the via is exposed after BEOL processing 400 has been completed on the front side. The newly, bottom-exposed porous paste is then sealed using the polyimide seal process, followed by chemical mechanical processing. This results in a bottom seal 500. (Via sidewall and bottom metallization are not shown in the figure, but are normal process steps that may be implemented in this embodiment.) Also, due to reactive ion etch lag issues, it is not always possible to form the seal at the lining metal at the via bottom, leaving the possibility for the backside to have exposure of the porous paste in the via.

In another embodiment, an apparatus and method for applying the hot, low viscosity material may be employed using a heated wafer spinner in an enclosed system, which allows for control of the pressure in the environment, as depicted in FIG. 9. Using a spinner enclosed in a controlled environment, different depth penetrations of the solution may be achieved as a function of the chamber vacuum.

FIG. 9A diagrams a controlled ambient application tool for the sealant material. Sealed supply chamber 630 is heated to a required temperature to liquefy and lower the viscosity of the selected polyimide. Supply tubing 610 and a supply nozzle are thermally isolated in order to control their temperature close to the supply chamber temperature. A mechanical chuck 600 holding the wafer with the paste-filled deep vias rotates in a chamber 650 and is resistively heated through its supporting axle 690 or radiantly heated by a primary heat source 605. Reduced chamber pressure for increasing impregnation depth is possible through an output port 670 connected to a vacuum pump. Excess material is collected in the bowl 620 below the chuck, which is also removable. A valve 640 is fitted on the tubing 610 to control the polymer flow onto the wafer surface. If chamber evacuation (vacuum) is not utilized, a pump set-up (not shown) or a piston configuration (not shown) may be required to force the polymer flow onto the wafer surface.

FIG. 9B details the top surface of the mechanical chuck 600 of FIG. 9A. The mechanical chuck 600 is shown with three contact points 625 and one pin 635 to fit the notch of the wafer and hold the wafer in place during the polymer application. The contact points and the pin all extend above the surface of the chuck 600 to a height equal to the approximate thickness of the wafer used.

Figure 10B:
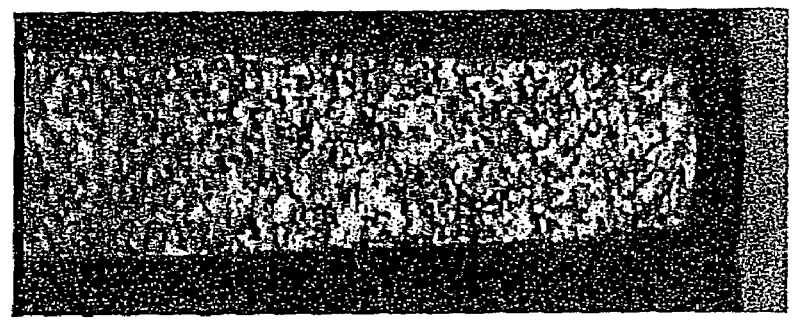
FIG. 10 depicts a thick copper coating as the sealant.
Figure 10A:
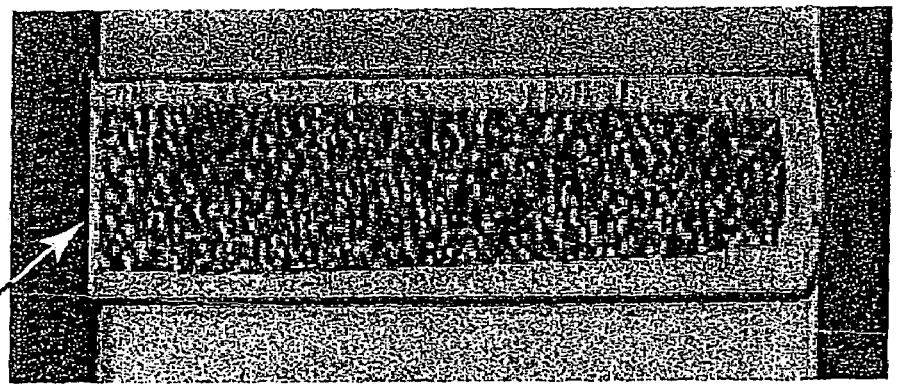

As an alternative approach to a polymer sealant, FIG. 10 depicts a thick copper coating as the sealant. This coating was introduced using a jet plasma deposition technique, although other deposition methods may be utilized, and the approach is not limited to any particular deposition method. FIG. 10A depicts a bright field image of the fluorescent dye exposed by the jet copper sealed via. FIG. 10B depicts the fluorescence microscopy image of the via of FIG. 10A with thorough dye penetration into the entire via as evidenced by the exposure to the fluorescent light.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A semiconductor chip package assembly comprising:
   a silicon substrate;
   at least one semiconductor chip;
   at least one electrically conductive via in said silicon substrate having at least one exposed end and porous material filled therein; and
   a sealant reflowed into and infiltrating within said porous material of said at least one electrically conductive via, and sealing said porous material, said sealant including a polymeric material.

2. The semiconductor chip package assembly of claim 1 wherein said polymeric material includes a polyimide material or a high thermally stable, thermally curable material.

3. The semiconductor chip package assembly of claim 1 wherein said polymeric material includes a polyimide precursor solution.

4. The semiconductor chip package assembly of claim 3 wherein said polyimide precursor solution includes a high percentage concentration of solids having viscosity approximately 1cP to approximately 150 cP.

5. The semiconductor chip package assembly of claim 2 wherein said polyimide material is neat thermally curable material with low viscosity and low melting point in its precursor state.

6. The semiconductor chip package assembly of claim 2 wherein said thermally stable, thermally curable material includes a polyamidoamine material, PMDA-ODA, BPDA-PDA, or PI2562.

7. The semiconductor chip package assembly of claim 1 wherein said sealant includes a deposited copper coating.

* * * * *